United States Patent
Oda et al.

(10) Patent No.: US 8,247,890 B2
(45) Date of Patent: Aug. 21, 2012

(54) WIRING CIRCUIT STRUCTURE AND MANUFACTURING METHOD FOR SEMICONDUCTOR DEVICE USING THE STRUCTURE

(75) Inventors: Takashi Oda, Ibaraki (JP); Shigenori Morita, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 109 days.

(21) Appl. No.: 12/952,404

(22) Filed: Nov. 23, 2010

(65) Prior Publication Data
US 2011/0127657 A1  Jun. 2, 2011

(30) Foreign Application Priority Data
Nov. 27, 2009 (JP) ................................. 2009-270430

(51) Int. Cl.
*H01L 23/495* (2006.01)
(52) U.S. Cl. ................. 257/668; 257/780; 257/E23.056
(58) Field of Classification Search .................. 257/668, 257/780, E23.056
See application file for complete search history.

(56) References Cited

U.S. PATENT DOCUMENTS

| 5,186,383 A * | 2/1993 | Melton et al. ............ 228/180.22 |
| 2005/0269714 A1 * | 12/2005 | Akram et al. ................. 257/778 |
| 2008/0182400 A1 | 7/2008 | Machida et al. |
| 2009/0039490 A1 * | 2/2009 | Fan ............................... 257/686 |
| 2009/0085227 A1 * | 4/2009 | Shiraishi et al. .............. 257/778 |

FOREIGN PATENT DOCUMENTS

JP  2008-124077 A  5/2008

* cited by examiner

*Primary Examiner* — Trung Q Dang
(74) *Attorney, Agent, or Firm* — Leydig, Voit & Mayer, Ltd.

(57) ABSTRACT

A conductor layer 2 is formed as a circuit pattern on a base insulating layer 1, a terminal 3 is formed thereon, and a supporting column 4 is formed in the vicinity of the terminal on the upper face of the base insulating layer 1. Here, supposing the protrusion height B of the bump from the element to be connected is B, the height of the supporting column is H, the height of the terminal is h, and the layer thickness of the terminal is t, as measured from the upper face of the base insulating layer as the reference surface, the height H of the supporting column is determined to satisfy B<H≦h+B wherein t<B, or h<H≦h+B wherein t≧B. As a result, the supporting column functions as a spacer to suppress compression that causes the solder of the terminal to reach the electrode of the element.

10 Claims, 9 Drawing Sheets

WIRING CIRCUIT STRUCTURE AND MANUFACTURING METHOD FOR SEMICONDUCTOR DEVICE USING THE STRUCTURE

FIELD OF THE INVENTION

The present invention relates to a wiring circuit structure to be connected to a semiconductor element to form a semiconductor device, and a method of producing a semiconductor device using the wiring circuit structure.

BACKGROUND OF THE INVENTION

Semiconductor elements (hereinafter also simply referred to as "elements") configured with various semiconductor materials such as ICs prepared using silicon semiconductors and organic EL elements prepared using organic semiconductors are usually produced by repeatedly forming a matrix of multiple elements on a wafer substrate, then dicing the substrate into individual elements known as chips.

In the description below, a wafer substrate having multiple semiconductor elements formed thereon (pre-dicing state) is also referred to as "a semiconductor wafer". Semiconductor elements prepared by once dicing semiconductor elements in the semiconductor wafer into individual chips, thereafter rearranging only those chips of acceptable quality on a sheet of the same shape as the wafer substrate, are also understood to be included in the semiconductor wafer.

In addition to a basic element structure, a semiconductor element is provided with various wiring circuit structures (may be referred to as wiring circuit layers) during the stage of a semiconductor wafer to achieve functional enhancement of the element and for other purposes. Examples of such wiring circuit structures include redistribution layers.

Figure 7:
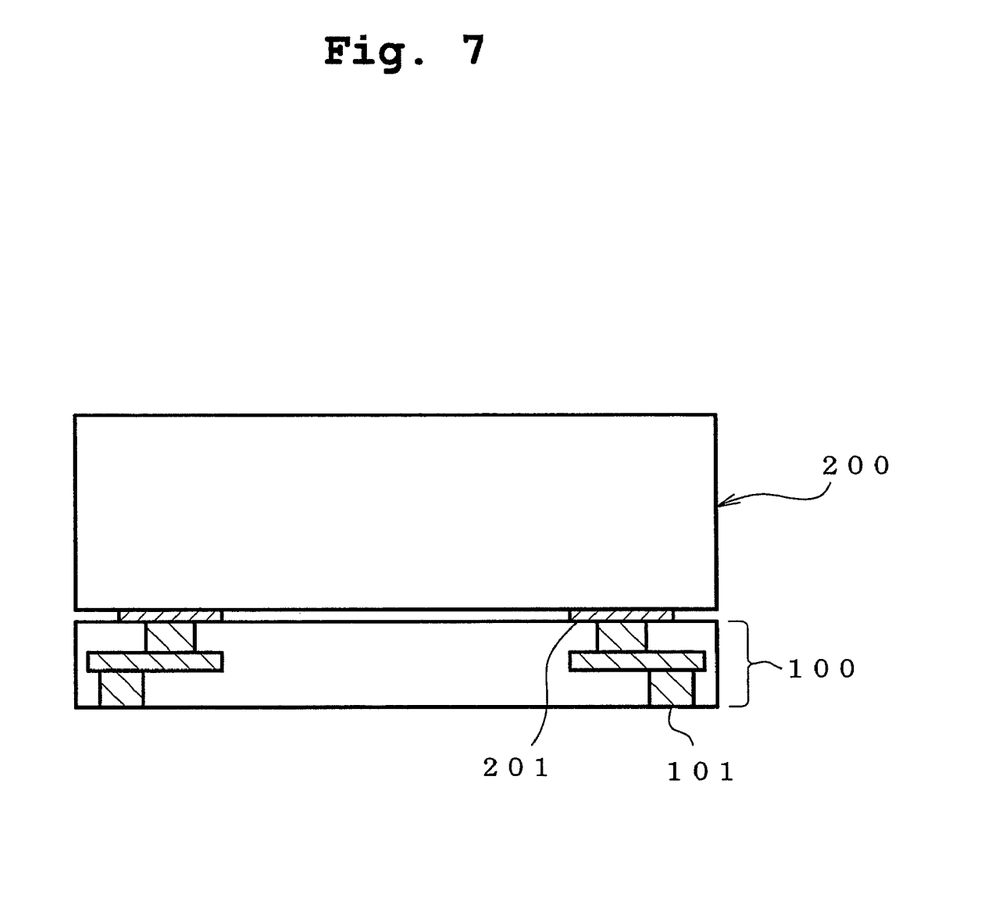
FIG. 7 is a cross-sectional view schematically showing a semiconductor element provided with a wiring circuit structure, wherein the face on which the electrode of the semiconductor element is formed is illustrated downward.

As shown in FIG. 7, an element 200 with a wiring circuit structure 100 added thereto is one semiconductor device provided with a connection conductor 101 that facilitates connection with an external conductor (external circuit and the like), compared with the original element simply having an exposed electrode 201. In FIG. 7, the electrode 201 of the element is illustrated as if it is much protruded from the element for the sake of emphasis, so as to indicate its position clearly. In the reality, however, the amount of protrusion of the electrode is small, and the wiring circuit structure 100 and the element 200 are in close contact with each other because the upper face of the wiring circuit structure 100 is made of a flexible adhesive layer and the like.

A known method of providing a wiring circuit structure for an element comprises forming a bump on an electrode of each element during the stage of a semiconductor wafer, superposing thereon a separately formed wiring circuit structure of wafer size, and connecting them to each other by pressing or melt-adhering a terminal of the wiring circuit structure to the bump of each element.

Figure 8:
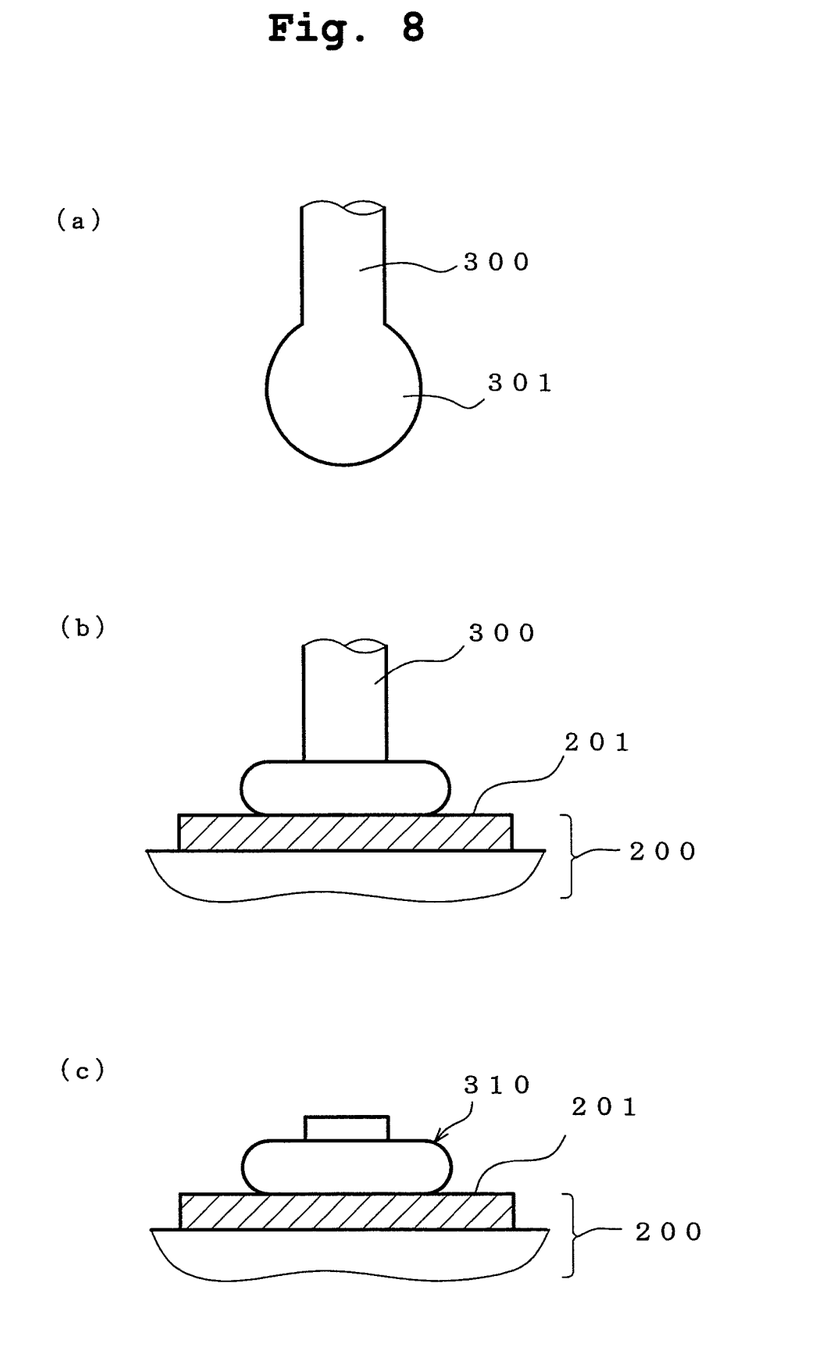
FIG. 8 shows the step of forming a stud bump, wherein the face on which the electrode is formed is illustrated upward.

Here, a stud bump is representative of the bump formed on the electrode of an element (e.g., JP-A-2008-124077). A stud bump 310 is formed by melting a tip 301 of a wire 300 of a bump metal (mainly gold) into a ball, as shown in FIG. 8(a), then connecting the ball to the electrode of an element, as shown in FIG. 8(b), and cutting the wire in the vicinity of the ball, as shown in FIG. 8(c), to leave the tip containing the ball on the electrode.

A wiring circuit structure of wafer size is a structure wherein a large number of individual wiring circuit structures assemble together in a way such that their positions correspond to those of the individual elements in the semiconductor wafer, the wiring circuit structures being formed in predetermined positions on one insulating substrate having a large area.

Figure 9:
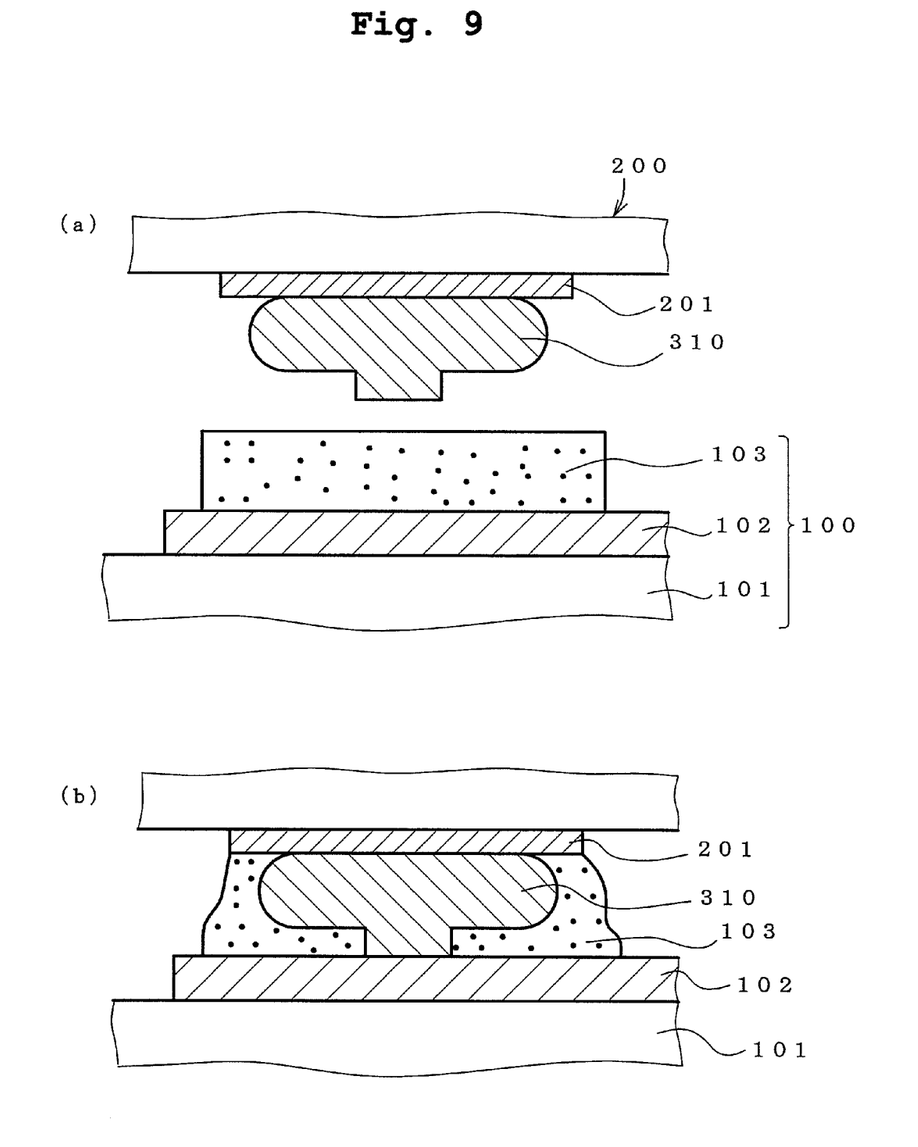
FIG. 9 is a cross-sectional view to explain the problem of contact of the electrode and the terminal, that can arise in connecting a conventional semiconductor element and a wiring circuit structure. As in FIG. 7, the face on which the electrode of a semiconductor element is formed is illustrated downward.

FIG. 9(a) shows a state wherein a stud bump 310 is formed on each electrode 201 of a semiconductor element 200, and a terminal of a wiring circuit structure 100 is connected thereto. In the figure, the wiring circuit structure 100 is illustrated as a structure wherein a conductor pattern 102 is present on a base insulating layer 101, and a terminal 103 is formed on the conductor pattern. In some cases, however, the structure, has the conductor pattern and even the terminal 103 covered by an adhesive layer.

In the connection shown in FIG. 9(a), variation of the height of the stud bump 310 can reduce the connection reliability. In contrast, in JP-A-2008-124077, for example, the influence of height variation is reduced by interposing a conductive paste in the connection.

Referring to FIG. 9(a), when the terminal 103 of the wiring circuit structure 100 is made of a solder, any variation of the height of the partner stud bump 310 prevents uniform pressurization in bonding each bump and the corresponding terminal. For example, in pressure-bonding together a bump taller than other bumps (more protruded from the electrode surface than the other bumps) and the terminal, an excess pressure is exerted. In this case, as shown in FIG. 9(b), the stud bump 310 can fret in the terminal 103 deeply, which in turn causes the terminal 103 to be much deformed and come in contact with the electrode (usually, aluminum) 201 of the element, so that there are apprehensions of corrosion of the electrode due to contact with the solder which is the material for the terminal.

It is an object of the present invention to provide a structure for a wiring circuit in connecting the wiring circuit structure to a semiconductor element having a bump provided on an electrode thereof, wherein the structure is capable of suppressing the excess compression of the bump on the element side and the terminal of the wiring circuit structure.

SUMMARY OF THE INVENTION

The present inventors extensively investigated to solve the above-described problems, and found that the problems can be solved by providing a supporting column in the vicinity of a terminal of a wiring circuit structure, and using the same as a spacer that defines the lower limit of the distance between the electrode surface of an element and the upper face of the terminal of the wiring circuit structure. The inventors conducted further investigations based on this finding, and have developed the present invention. Accordingly, the primary constitution of the present invention is as follows.

(1) A wiring circuit structure to be connected to a semiconductor element having a bump provided on an electrode thereof, comprising:

at least a structure having a conductor layer formed as a circuit pattern on a base insulating layer, and a terminal for connection to the bump of the semiconductor element formed on the conductor layer, wherein:

a supporting column is formed in the vicinity of the terminal on the upper face of the base insulating layer, supposing the protrusion height of the bump from the semiconductor element to be connected is B, the height of the supporting column is H, the height of the terminal is h, and the layer thickness of the terminal is t, as measured from the upper face of the base insulating layer as the reference surface, the height H of the supporting column is determined to satisfy;

B<H<h+B when a semiconductor element having a bump with the provision of t<B is to be connected, or h<H<h+B when a semiconductor element having a bump with the provision of t≧B is to be connected;

whereby compression that causes the terminal to reach the electrode of the element is prevented by the presence of the supporting column when the wiring circuit structure is superposed on the semiconductor element to bring the terminal into contact with the bump of the element, and the two members are pressed and connected to each other.

(2) The wiring circuit structure according to (1), wherein the height H of the supporting column is determined;

to satisfy B<H<h+B when a semiconductor element having a bump with the provision of t<B and h<B is to be connected, or to satisfy h<H<h+B when a semiconductor element having a bump with the provision of t≧B and h≧B is to be connected.

(3) The wiring circuit structure according to (1) or (2), wherein the protrusion height B of the bump from the semiconductor element to be connected is 20 μm to 60 μm.

(4) The wiring circuit structure according to any one of (1) to (3), wherein the semiconductor element is in the form of a semiconductor wafer prior to division with a plurality of semiconductor element structures formed on a wafer substrate, and the wiring circuit structure is a set of a required number of individual wiring circuit structures collectively provided and adjacently joining to each other to allow themselves to be connected to the individual semiconductor elements in the semiconductor wafer, the individual base insulating layers linking together to form one base insulating layer.

(5) The wiring circuit structure according to any one of (1) to (4), wherein the supporting column is formed with the same material as the base insulating layer.

(6) The wiring circuit structure according to any one of (1) to (5), wherein at least the surface layer of the terminal made of a solder.

(7) The wiring circuit structure according to any one of (1) to (6), wherein the base insulating layer is formed on a metal support substrate in a way such that the base insulating layer can be separated.

(8) A method of producing a semiconductor device having a structure comprising a lamination of a semiconductor element with a bump provided on an electrode and a wiring circuit structure, comprising the step of connecting the terminal of the wiring circuit structure according to any one of (1) to (7) to the bump of the semiconductor element.

(9) The manufacturing method according to (8), wherein the semiconductor element is in the form of a semiconductor wafer prior to division with a plurality of semiconductor element structures foamed on a wafer substrate, the wiring circuit structure being a set of a required number of individual wiring circuit structures collectively provided and adjacently joining to each other to allow themselves to be connected to the individual semiconductor elements in the semiconductor wafer, and the base insulating layers contained in each wiring circuit structure linking together to form one base insulating layer.

(10) The manufacturing method according to (9), wherein the base insulating layer is formed on a metal support substrate in a way such that the base insulating layer can be separated, comprising the step of separating the metal support substrate from the base insulating layer after the step of connecting the terminal of the wiring circuit structure to the bump of the semiconductor element.

BRIEF DESCRIPTION OF THE DRAWINGS

FIG. 1(a) is a cross-sectional view showing an example configuration of the wiring circuit structure. FIG. 1(b) shows how the support acts when the wiring circuit structure is connected to a semiconductor element.

In these figures, numerical codes denote the following: 1; base insulating layer, 2; conductor layer, 3; terminal, 4; supporting column, 200; semiconductor element, 201; electrode, 310; bump.

DETAILED DESCRIPTION OF THE INVENTION

The wiring circuit structure is characterized in that a supporting column 4 is formed on the upper face of a base insulating layer 1, as shown in FIG. 1(a). The supporting column 4 is located in the vicinity of a terminal 3.

The height H of the supporting column 4 is set as appropriate in view of the mean protrusion height B, which is the mean of the protrusion heights of all bumps 310 of the element 200 to be connected with the wiring circuit structure.

With this configuration, as shown in FIG. 1(b), even when the element and the wiring circuit structure are superposed and pressed, the supporting column 4 functions as a spacer, thus preventing the electrode of the element and the terminal of the wiring circuit structure from being excessively compressed and the metal material for the terminal from being in contact with the electrode of the element.

The wiring circuit structure is connected to a semiconductor element and functions as a redistribution layer. Hence, the wiring circuit structure is also a redistribution layer prepared separately from the semiconductor element.

Because a large number of wiring circuit structures of large areas that can accommodate a large number of wafers can easily be produced on a roll-to-roll basis by separately producing wiring circuit layers, there is an advantage that the manufacturing cost decreases compared with the formation of a redistribution directly on each semiconductor wafer.

The manufacturing method of the present invention makes it possible to connect selected wiring circuit structures of acceptable quality only to elements in a wafer state, so that useless disposal of elements of acceptable quality is avoided.

In an embodiment wherein a metal support substrate is further provided for the lower face of the base insulating layer of the wiring circuit structure in a way such that the metal support substrate can be separated, the metal support substrate confers appropriate rigidity to the wiring circuit structure, thus improving the handleability until the wiring circuit structure is stacked on a semiconductor element (particularly in the stage of a semiconductor wafer).

Hereinafter, the manufacturing method of the present invention is described with reference to specific examples. As used herein, terms indicating upward or downward, such as "on something", "upper face" and "lower face", are only to explain the positional relationship of layers, and are not to be construed as limiting the actual vertical position of a wiring circuit layer or a semiconductor device.

As shown in FIG. 1(a), the wiring circuit structure according to the present invention has at least a structure wherein a conductor layer 2 is formed as a circuit pattern on a base insulating layer 1, and a terminal 3 is formed on the conductor layer 2. Formed on the base insulating layer 1 is a supporting column 4 in the vicinity of the terminal 3. As stated below, the wiring circuit structure is preferably provided with an adhesive layer that covers the conductor layer and the terminal, which, however, is not illustrated here.

Formed on the electrode 201 of the semiconductor element 200 to be connected is a bump 310; the terminal 3 of the wiring circuit structure functions as a terminal for connection to the bump.

Figure 1:
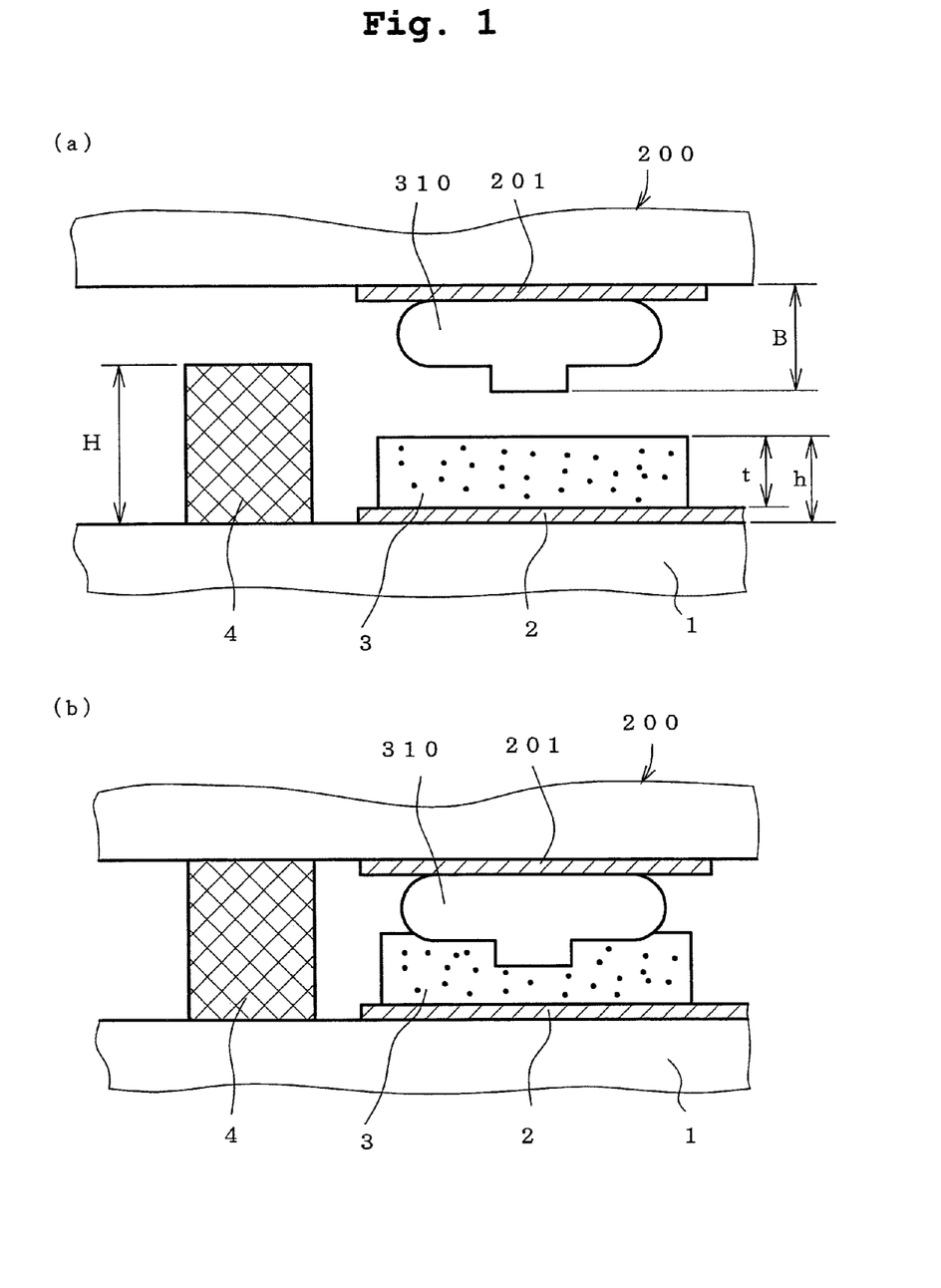
FIG. 1 explains a configuration of the wiring circuit structure according to the present invention.

As described with respect to FIG. 7 in explaining the background art, the thickness of the electrode 201 of the element is illustrated in FIG. 1 as well as if it is much protruded from the element for the sake of emphasis. In fact, however, the amount of protrusion of the electrode is small, and the surface of the electrode and the surface of the element may be regarded as being on the same plane.

Here, it is important that the height of the supporting column 4 be deter mined to satisfy the following conditions. Supposing that the protrusion height B of the bump 310 from the semiconductor element 200 to be connected is B, the height of the supporting column 4 is H, the height of the terminal 3 is h, and the layer thickness of the terminal 3 (height from the upper face of the conductor layer 2) is t, as measured from the upper face of the base insulating layer 1 as the reference surface, the height H of the supporting column is determined to satisfy $B<H<h+B$ when a semiconductor element having a bump with the provision of $t<B$ is to be connected, and, to satisfy $h<H<h+B$ when a semiconductor element having a bump with the provision of $t\geq B$ is to be connected.

Hence, comparing the value of the thickness t of the terminal of the wiring circuit structure and the value of the height B of the bump of the element to be connected, the greater value is taken as the lower limit of the height H of the supporting column.

Here, all of the height H of the supporting column, the height h of the terminal, and the layer thickness t of the terminal are design values or mean values to be managed in the manufacturing.

The protrusion height B of the bump is the mean of the protrusion heights of the bumps formed on all electrodes of the element to be connected (amounts of protrusion as measured from the element surface as the reference surface).

When the wiring circuit structure is superposed on a semiconductor element 200 to bring the terminal 3 into contact with the bump 310 of the element, and the two members are pressed and connected to each other, as shown in FIG. 1(b), the supporting column 4 whose height has been thus determined functions as a spacer, whereby excess compression of the bump 310 and the terminal 3 is inhibited, and the reach of the material for the terminal to the electrode is also inhibited.

More specifically, regarding the height H of the supporting column, the upper limit thereof is always determined according to [the height h of the terminal+protrusion height B of the bump], and the lower limit thereof is determined according to the protrusion height B of the bump, or the thickness t of the terminal, as is evident from the above-described formulas ($B<H<h+B$) and ($h<H<h+B$).

Therefore, the layer thickness t of the terminal and the height h of the terminal may be previously designed as appropriate according to the protrusion height B of the bump specific for the lot number of an element to which the wiring circuit structure is to be connected, out of elements distributed in the market, then the height H of the supporting column may be determined according to the above-described formulas ($B<H<h+B$) and ($h<H<h+B$); the wiring circuit structure may be then produced, and wiring circuit structures having a supporting column that meets the above-described formulas may be selected and used for various elements.

Alternatively, a wiring circuit structure dedicated for each element for which optimum t, h, and H have been determined may be produced.

When the relationship between the protrusion height B of the bump of the element to be connected and the thickness t of the terminal is $t<B$, or when the relationship is $t<B$ and $h<B$ for more preferably limiting conditions, the height H of the supporting column is determined to obtain $B<H<h+B$.

In this case, the height H of the supporting column is set at a level higher than the protrusion height B of the bump (i.e., because of $t<h<B<H$), so that the supporting column serves as a spacer to interfere with the excess contact of the element and the wiring circuit structure, thus preventing the terminal from coming in contact with the partner electrode.

Conversely, when the relationship between the protrusion height B of the bump of the element to be connected and the thickness t of the terminal is $t\geq B$, or when the relationship is $t\geq B$ and $h\geq B$ for more preferably limiting conditions, the height H of the supporting column is determined to obtain $h<H<h+B$.

In this case, the height H of the supporting column is set at a level higher than the height h of the terminal (i.e., because of $B\geq t<h<H$), so that the supporting column serves as a spacer to interfere with the excess contact of the element and the wiring circuit structure, thus preventing the terminal from coming in contact with the partner electrode.

In both cases of $t<B$ and $t\geq B$, the upper limit of the height H of the supporting column is determined by $H<h+B$, so that the supporting column will not prevent the bump and the terminal from contacting with each other.

Examples of useful materials for base insulating layers include, but are not limited to, publicly known synthetic resins such as polyimide resin, acrylic resin, polyether nitrile resin, polyether sulfone resin, epoxy resin, polyethylene terephthalate resin, polyethylene naphthalate resin, and polyvinyl chloride resin, composites of these resins with synthetic fiber cloth, glass cloth, nonwoven glass fabric, microparticles such as of $TiO_2$, $SiO_2$, $ZrO_2$, minerals, and clay, and the like.

The base insulating layer is preferably a thinner, flexible insulating layer with higher mechanical strength and better electrical characteristics (insulating characteristic and the like). From this viewpoint, polyimide resin, epoxy resin, and glass cloth-epoxy resin composite are preferable materials for the base insulating layer.

The thickness of the base insulating layer is preferably 3 to 50 μm.

Because the base insulating layer is thin and flexible, it is preferable that a metal support substrate for improving the handleability of the wiring circuit structure be provided on the lower face of the base insulating layer in a way such that the metal support substrate can be separated, as described below.

Examples of materials for the conductive layer to be formed as a circuit pattern include simple metals selected from among copper, gold, silver, platinum, lead, tin, nickel, cobalt, indium, rhodium, chromium, tungsten, ruthenium and the like, and alloys comprising one or more thereof (e.g., solders, nickel-tin, gold-cobalt and the like). In particular, metals that permit electroplating or electroless plating are preferably used. Copper is preferred because of its excellency in the ease of forming a conductive layer circuit pattern and electrical characteristics.

Although the thickness of the conductive layer is not particularly limited, it is preferably about 2 to 50 μm, more preferably in the range of 5 to 30 μm.

The terminal is a kind of contact point or a connecting pad, formed on a conductor layer.

Herein, problems arising with the use of a solder as the material for the terminal are described; however, the material for the terminal may be a contact point material such as copper, gold, silver, indium, or nickel, as well as a solder, and the terminal may be a laminated structure such as one wherein the surface layer is a solder.

Examples of such structures of the terminal include ones prepared by forming one of the aforementioned materials as a layer with a predetermined thickness on a conductor layer. If necessary, an adhesive layer may be formed to cover the terminal, and the adhesive layer may be provided with an opening portion, with the end exposed to the bottom in the opening portion.

Although the method of forming a terminal is not particularly limited, printing, plating and the like are preferred methods.

As shown in FIG. 1(a), when a terminal 3 is provided directly on the upper face of a conductor layer 2, the thickness t of the terminal 3 is preferably about 2 μm to 50 μm, more preferably in the range of 2 to 30 μm, considering the protrusion height B of an ordinary bump. If the thickness t of the terminal is thinner than 10 μm, sufficient connection is sometimes unachievable; if the thickness is thicker than 50 μm, the variation of the thickness t of the terminal widens, which in turn can affect the reliability of the connection of the element to the bump.

Therefore, in the embodiment shown in FIG. 1(a), considering the above-described range of the thickness of the conductor layer 2, the height h of the terminal 3 (=thickness of conductor layer 2+thickness t of terminal 3) as measured from the upper face of the base insulating layer 1 as the reference surface is h=4 to 100 μm, preferably in the range of h=7 to 60 μm.

The protrusion height B of a bump of an ordinary semiconductor element is 20 μm to 60 μm, and a particularly versatile and useful height is 30 μm to 50 μm.

In determining the lower limit of the height H of the supporting column, B<H is sufficient in case of t<B, and h<H is sufficient in case of t≧B.

Figure 2:
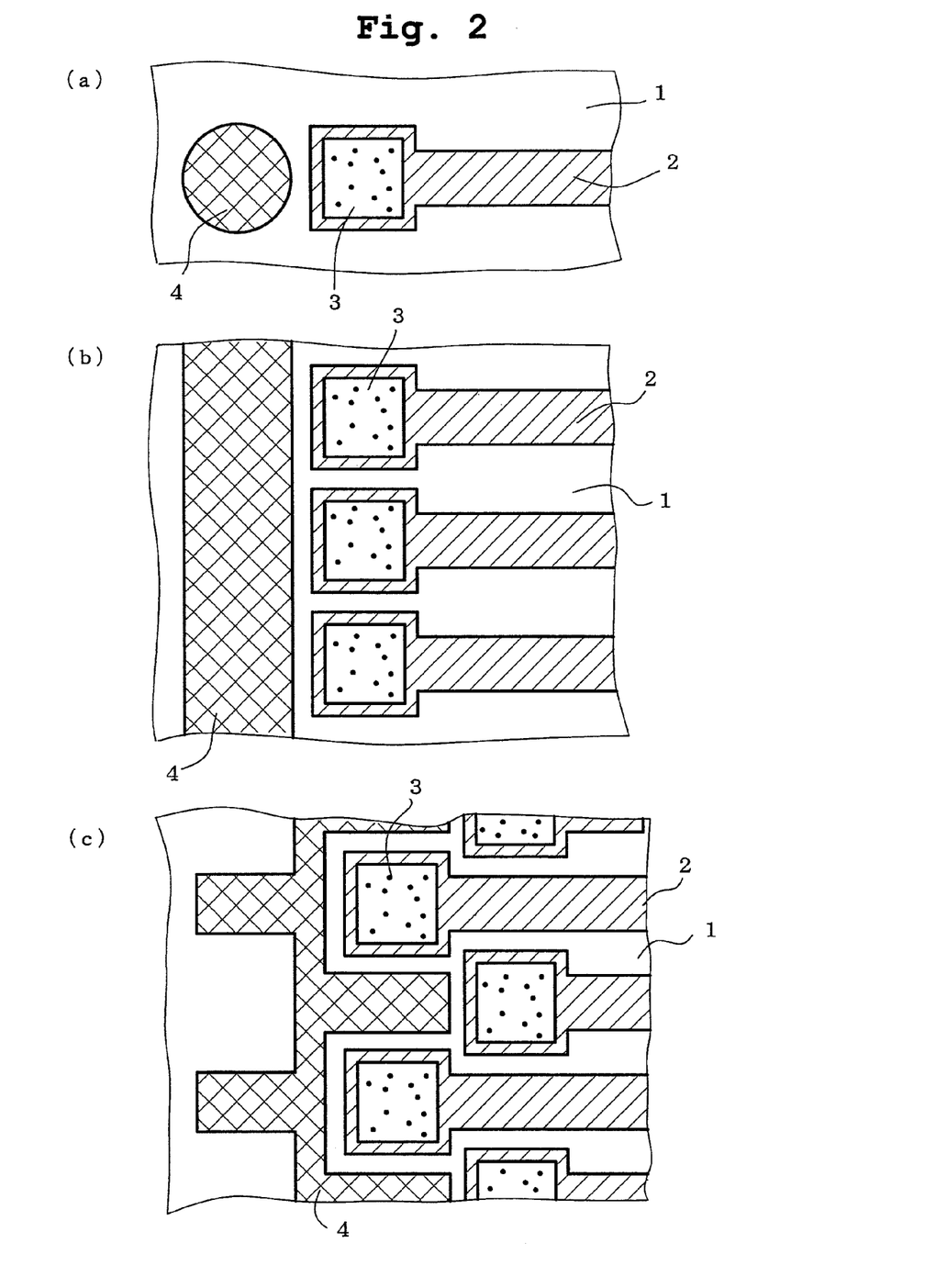
FIG. 2 shows a conductor layer formed on a base insulating layer, a terminal thereon, and a supporting column in the vicinity thereof, in the wiring circuit structure according to the present invention, as viewed from above.

FIG. 2 shows a conductor layer 2 formed on a base insulating layer 1, a terminal 3 thereon, and a supporting column 4 in the vicinity thereof, as viewed from above.

The shape of the supporting column 4 may be a prism or the like, as well as a cylindrical shape as shown in FIG. 2(a), with no limitations on the outer peripheral shape of the supporting column as viewed from above. Rather than providing only one single supporting column alone for one terminal, a plurality of supporting columns may be provided dispersively around the terminal, or supporting columns in sequence like a wall may be provided around the terminal.

Because the electrodes of an element are densely arranged in a wide variety of arrangement patterns at close distances on the surface of the element, the corresponding terminals 3 may be arranged in a straight row as shown in FIG. 2(b), in a dense zigzag row as shown in FIG. 2(c), in an even denser zigzag row (not illustrated) and the like.

The supporting columns 4 may be separately formed corresponding to the terminals 3 thereof, or may be formed in the form of mutually joined adjoining supporting columns, as shown in FIGS. 2(b) and (c).

Although the bottom area of the supporting column also depends on the elastic modulus of the material, the supporting column preferably functions as a spacer that does not easily undergo compressive deformation, provided that the bottom area thereof is about 30% to 500% of the bottom area of the terminal 3.

The position for forming the supporting column may be any vicinity to the terminal that allows the supporting column to function as a spacer.

[To form a supporting column in the vicinity of the terminal] means that the distance between the terminal and the supporting column (gap size) is made to be 500 μm or less, preferably 100 μm or less. Although the lower limit of the distance between the terminal and the supporting column may be zero, it is preferable that a distance of 5 μm or more, preferably 20 μm or more, be secured in view of the positional accuracy at the time of forming the supporting column.

Although the material for the supporting column is not particularly limited, an insulating material is preferred for contacting with and pressing the element, with greater preference given to an insulating material having an elastic modulus in an appropriate range (about 1 to 10 GPa) so as to allow the supporting column to well function as a spacer without causing damages such as fretting in the element, and without easily undergoing deformation.

Preferable materials for the supporting column include the above-described resin materials mentioned as materials for the base insulating layer. In particular, it is preferable to use the same material for the base insulating layer and the supporting column because the stress due to the difference in linear expansion coefficient between the base insulating layer and the supporting column at their interface is reduced. From this viewpoint, preferred materials for the supporting column are polyimide resins, epoxy resins, and glass cloth-epoxy resin-composite.

Available methods of forming a supporting column on a base insulating layer are screen printing, dispenser coating, and photolithography using a photosensitive material.

It is preferable that an adhesive layer 5 for bonding the wiring circuit structure and a semiconductor element be provided on the upper face of the base insulating layer 1, as shown in FIG. 3(a). In this case, as in the embodiment shown in FIG. 3(a), the conductor layer 2, terminal 3, and supporting column 4 may be completely embedded in the adhesive layer 5; the upper portion of the supporting column may protrude from the upper face of the adhesive layer (not illustrated); openings may be provided on the upper face of the adhesive layer covering the terminal or the supporting column to expose the terminal or the supporting column to the bottom of each opening (not illustrated); and the upper face of the terminal may be exposed to the upper face of the adhesive layer (not illustrated).

Preferable materials for the adhesive layer 5 include, but are not limited to, thermoplastic resins such as polysulfone, polyether sulfone, polyhydantoin, polyether imide, polyester, polyimide siloxane, and siloxane-modified polyamide imide, epoxy resins, acrylic resins, silicone resins, polyimide resins and the like; these may be used in blends.

Useful epoxy resins include, but are not limited to, epoxy resins blended with a thermoplastic resin, rubber, elastomer or the like, silica hybrids, nanoparticle-dispersed epoxy resins and the like.

Examples of useful acrylic resins include, but are not limited to, epoxy acrylate, urethane acrylate, silicone acrylate and the like.

The thickness of the adhesive layer as measured from the upper face of the base insulating layer 1 as the reference surface varies depending on the height h1 of the terminal and the height H of the supporting column, and is preferably about 4 to 120 μm.

Provided that the joining of the electrode of the element and the terminal of the wiring circuit structure causes the two members to be unified with sufficient mechanical strength, the insulating layer may consist of a publicly known non-adhesive insulator in place of an adhesive layer.

Figure 3:
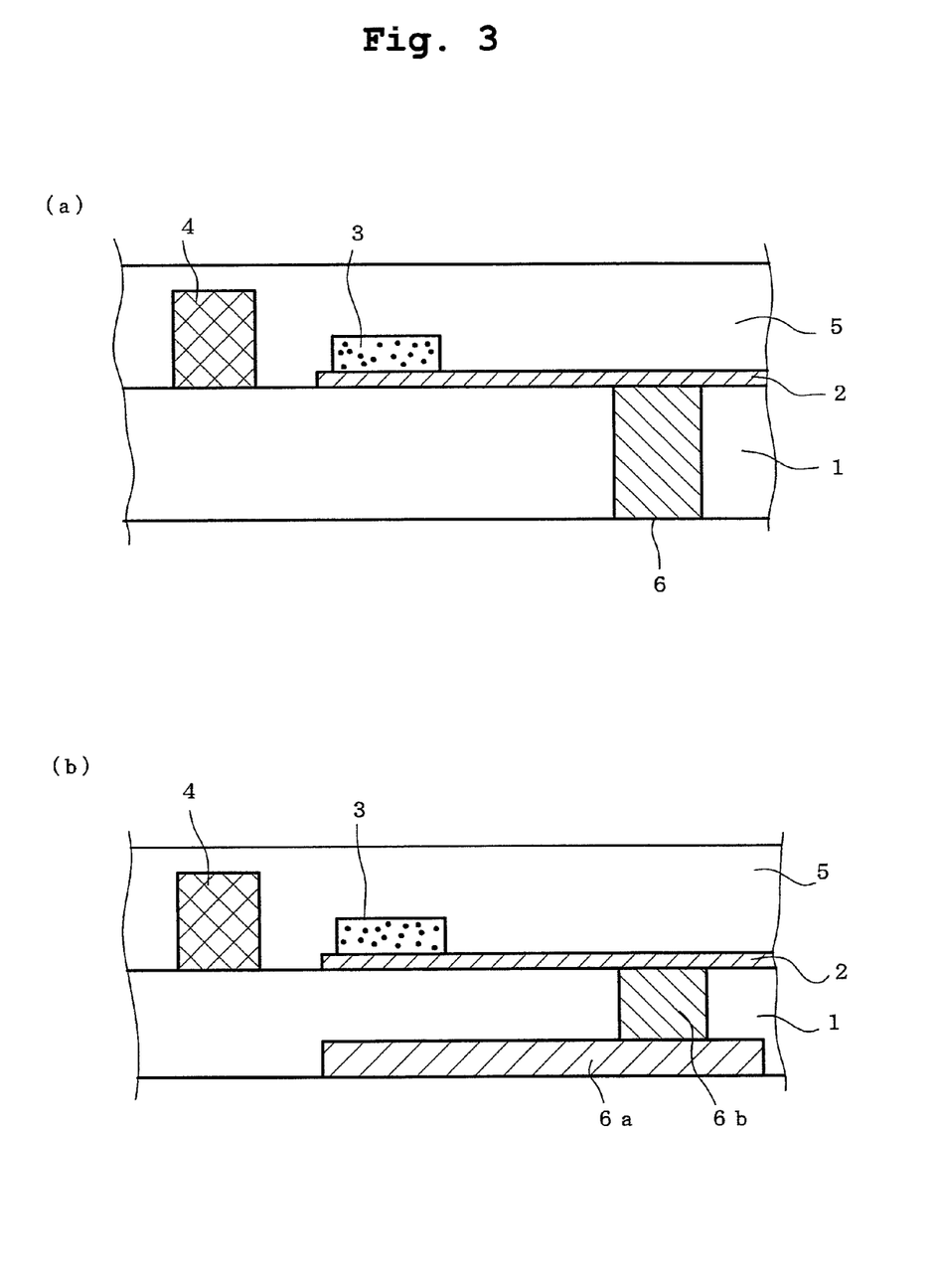
FIG. 3 is a cross-sectional view of an exemplary connection structure in the wiring circuit structure according to the present invention.

The choice of a connection structure via a conductor layer in the wiring circuit structure (i.e., a structure from the terminal to the other connection terminal through the conductor layer) is not particularly limited; a useful basic structure is exemplified in FIG. 3.

In the example of FIG. 3(*a*), a terminal 3 is provided on a conductor layer (circuit pattern) 2 on a base insulating layer 1, and an external connecting conductor 6 for connection to an external circuit and the like is exposed to the lower face of the base insulating layer 1, the terminal 3 and the external connecting conductor 6 are connected to each other via the conductor layer.

In the example of FIG. 3(*a*), the external connecting conductor 6 is the lower terminal of a conductive path penetrating the base insulating layer 1, and a metal film for contact point may be formed on the lower end face of the conductive path.

In the example of FIG. 3(*b*), the external connecting conductor 6*a* is a circuit pattern exposed to the lower face of the base insulating layer 1, and is connected to the conductor layer 2 via a conductive path 6*b*.

In other examples, the pattern of connection structure may be freely changed or combined with other patterns according to the intended use, including a structure wherein a plurality of terminals are connected to one external connecting conductor via one conductor layer, a structure wherein a plurality of terminals are connected to each other via one conductor layer but are not connected to a external connecting conductor, and the like, depending on the function of the electrode of the element.

The conductor layer may be a single layer, and may be a multilayer (multistage) structure wherein a first conductor layer is covered by a first insulator layer, on which a second conductor layer is provided, as shown in FIG. 3.

The conductive path for the external connecting conductor 6, shown in FIG. 3(*a*), is preferably cylindrical shape, the diameter thereof being 5 to 500 μm, preferably 5 to 300 μm.

Plating is a preferred method for forming a metal film for contact point on the lower end face of the conductive path. Useful materials for the metal film include simple metals such as copper, gold, silver, platinum, lead, tin, nickel, cobalt, indium, rhodium, chromium, tungsten, and ruthenium, and alloys consisting of two or more thereof and the like, with greater preference given to gold, tin, nickel and the like. Preferred modes of the metal film include a double-layer structure with an underlayer of Ni on the conductive path side and a surface layer of Au, and the like.

Examples of the semiconductor device to which the wiring circuit structure is to be connected include conventionally known elements such as those of simple structure like single light-emitting elements, arrays comprising an assembly thereof, organic semiconductor elements, ICs, processors with various operation circuits integrated therein, memories, photosensors, and image sensors, as well as multi-chip modules, MEMS (micro-electro-mechanical systems; devices wherein machine components, sensors, actuators, electronic circuits and the like are integrated on a substrate) and the like.

The wafer substrate to form a semiconductor element thereon may be any substrate for semiconductor elements; examples include semiconductor crystal substrates such as of silicon, as well as insulating crystal substrates, glass substrates, substrates consisting of an organic compound, and the like. Of these substrates, the most versatile ones are silicon crystal substrates (silicon wafers).

The bump provided in an electrode of a semiconductor element may be a solder bump, copper bump, gold bump or the like prepared by printing, plating, vapor evaporation and the like.

The protrusion height B of the bump is usually 20 μm to 60 μm, as stated above, and a particularly versatile and useful height is 30 μm to 50 μm.

Stud bumps, in particular, are likely to undergo height variation; the present invention is more advantageously applicable to stud bumps having a central diameter of 45 μm, for example, because they undergo height variation in the range of about ±8 μm. The material for the stud bump is usually gold.

In connecting the wiring circuit structure to a semiconductor element, it is preferable that a wiring circuit structure of wafer size be connected to a semiconductor wafer, rather than to individual chips after division.

A wiring circuit structure of wafer size refers to an assembly of a required number of individual wiring circuit structures assembling and adjacently joining to each other in a way such that they can be connected to the individual semiconductor elements in a semiconductor wafer. As such, a wiring circuit structure of wafer size is obtained by forming wiring circuit structures corresponding to individual elements (conductive paths, terminals, supporting column and the like for individual elements) on a single base insulating layer of wafer size with a large area.

The arrangement pattern of the individual wiring circuit structures contained in the wiring circuit structure of wafer size prior to division may be any one that corresponds to the array pattern of the elements in the semiconductor wafer to be connected and allows the connection of the individual elements and the individual wiring circuit structures.

The outer peripheral shape of the wiring circuit structure of wafer size prior to division as a whole may be the same as the semiconductor wafer or a corresponding shape, a shape with even a larger area that can include a plurality of semiconductor wafers (simple sheets, bands rolled out from a roll, and the like), the same shape as the element assembly region in each semiconductor wafer or a corresponding shape, and the like.

Supplementary members to locate the wiring circuit structure of wafer size prior to division and the semiconductor wafer and a means to increase the handleability may be added as appropriate.

Figure 4:
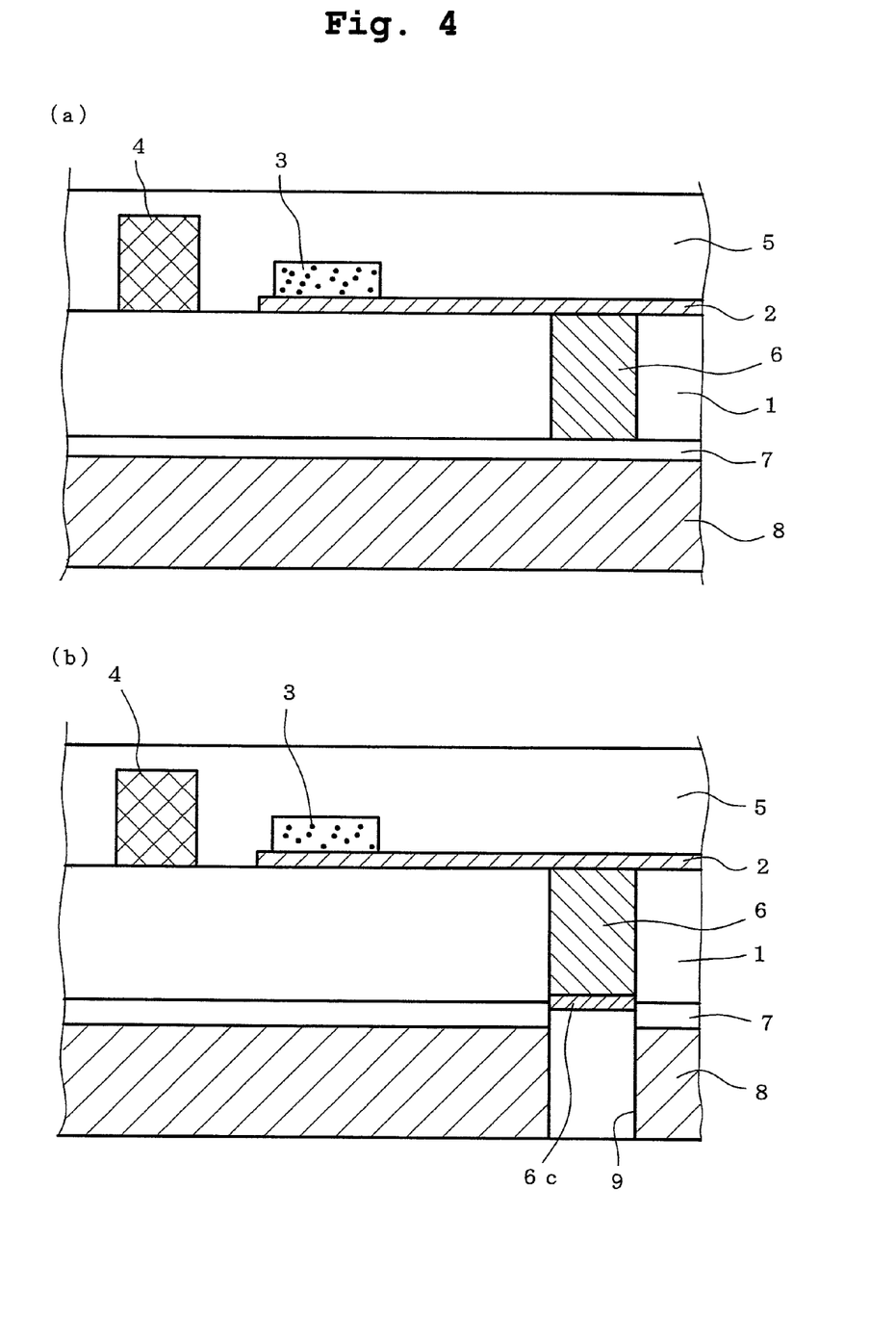
FIG. 4 is a cross-sectional view of an exemplary preferred embodiment of the wiring circuit structure according to the present invention.

In a preferred embodiment, a metal support substrate 8 be stacked on the lower face of the base insulating layer 1 in a way such that the metal support substrate can be separated, as shown in FIG. 4(*a*). In this embodiment, as described above in explaining the effect of the present invention, the metal support substrate 8 confers appropriate rigidity to the wiring circuit structure, thus improving the handleability until the wiring circuit structure is stacked on a semiconductor element.

Preferred materials for the metal support substrate include, but are not limited to, copper, copper alloys based primarily on copper, nickel, nickel alloys based primarily on nickel, alloys based primarily on nickel and iron, stainless steel, and the like.

To minimize the difference in the coefficient of linear expansion from the semiconductor wafer, an alloy based primarily on nickel and iron (e.g., 42 alloy) is preferably used.

The thickness of the metal support substrate is variable depending on the rigidity of the material, and is preferably about 10 µm to 200 µm, more preferably about 20 µm to 80 µm.

If the thickness of the metal support substrate is less than 10 µm, creases and wrinkles are likely to occur in the metal support substrate, which in turn reduces the handleability in the roll process. If the thickness of the metal support substrate exceeds 200 µm, the winding diameter increases due to the rigidity thereof, which in turn hampers the handling in the roll process and also interfere with the processing by etching.

To facilitate the smoother peeling of the metal support substrate and the wiring circuit layer, a structure is preferable wherein a release layer is present therebetween as shown in FIG. 4(a). It is preferable that the release layer be formed in a way such that the release layer is easily detached from the base insulating layer and is unlikely to detached from the metal support substrate, and that the release layer is removable, together with the metal support substrate, from the base insulating layer.

Useful materials for the release layer include organic substances (silicone resin, polyimide and the like) and inorganic substances (metals, metal oxides, inorganic oxides and the like). The inorganic substances are exemplified by Ag, Ti, W, Ni, $SiO_2$ and the like.

Considering the steps of producing a wiring circuit layer and the high heat conditions during connecting the wiring circuit layer to a semiconductor wafer, greater preference is given to polyimide and the aforementioned inorganic substances because silicone resin can deteriorate.

When the release layer is formed as a polyimide layer, the thickness thereof is preferably 0.1 to 10 µm, with further preference given to 0.1 to 5 µm in preventing the entire wiring circuit layer from bowing.

When the release layer is formed as a layer consisting of one of the aforementioned inorganic substances, the thickness thereof is preferably 1 to 100 nm, with further preference given to 1 to 50 nm in preventing the entire wiring circuit layer from bowing.

When the release layer is a polyimide layer, useful methods of forming the layer include a method wherein a solution is coated, a method wherein the layer is deposited by electrodeposition or chemical vapor deposition (CVD), a method wherein a separately formed polyimide film is laminated, and the like. When the release layer is a layer consisting of an inorganic substance such as a metal, metal oxide, or inorganic oxide, useful methods of forming the layer include electroplating, vacuum evaporation, sputtering and the like.

As shown in FIG. 4(b), it is possible to protrude a metal layer 6c at the tip of the external connecting conductor (conductive path) 6 from the lower face of the base insulating layer 1 by providing an opening (through hole) 9 for the metal support substrate 8 at the position of the external connecting conductor.

Figure 5:
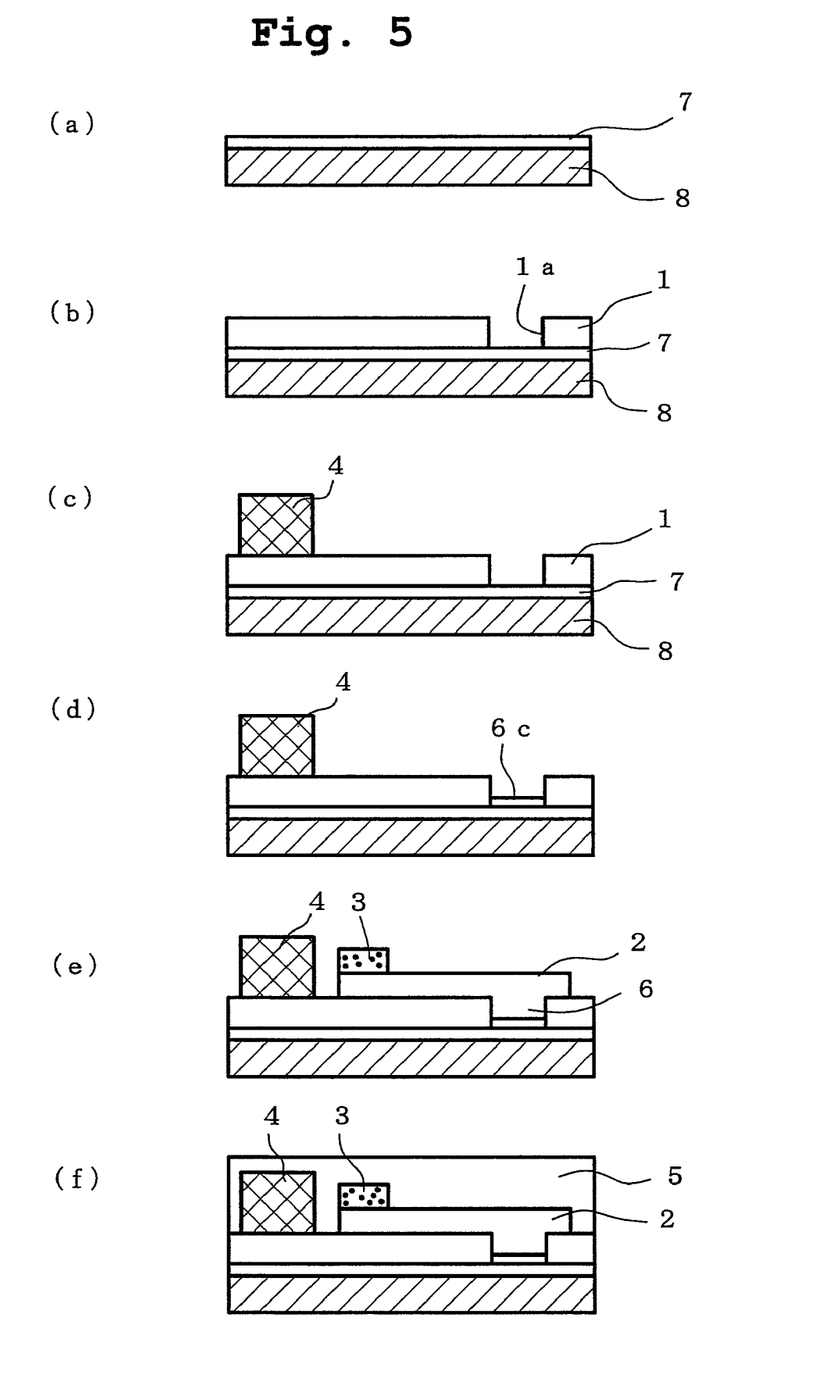
FIG. 5 is a schematic diagram showing how the various portions of a wiring circuit structure are sequentially formed on a metal support substrate.

In actual production of a wiring circuit structure having a metal support substrate in a way such that the metal support substrate can be separated, it is preferable that a metal support substrate 8 be first provided, a base insulating layer 1 be formed thereon in a way such that the base insulating layer can be separated, and other major portions be built thereon, as shown in FIG. 5.

Sequential formation of various layers of a wiring circuit structure on a metal support substrate can be achieved by applying conventionally known methods for producing circuit substrates or interposers, such as the semi-additive method and the subtractive method.

When a conductor layer is formed with a good conductor metal on a base insulating layer by the semi-additive method, or when a conductive path is formed by filling a good conductor metal in an opening provided in a base insulating layer, it is preferable that a seed film (metal thin film) that allows such a good conductor metal to deposit well on the conductor layer and the wall surface of the portion to constitute the conductive path be formed by sputtering in advance. Examples of useful materials for such seed films include simple metals such as copper, gold, silver, platinum, lead, tin, nickel, cobalt, indium, rhodium, chromium, tungsten, and ruthenium, alloys consisting of two kinds or more thereof, and the like.

Hereinafter, how to sequentially form each portion of a wiring circuit structure on a metal support substrate is explained with reference to FIG. 5. In FIG. 5, only the vicinity of one end is schematically illustrated in a magnified view, but the actual number of electrodes per element is 10 to 400, and each semiconductor wafer contains 200 to 1000 such elements, so that a number of desired wiring circuit structures corresponding to the elements of the semiconductor wafer will be formed on a metal support substrate of wafer size.

In the manufacturing method for a wiring circuit structure, a release layer 7 is first formed on a metal support substrate 8, as shown in FIG. 5(a).

Next, as shown in FIG. 5(b), a base insulating layer 1 is formed on the release layer 7. In the base insulating layer 1, an opening 1a is previously formed at a position to be a conductive path for an external connecting conductor to be formed in the subsequent step.

Next, as shown in FIG. 5(c), a supporting column 4 is formed at a predetermined position on the upper face of the base insulating layer 1. The position for forming the supporting column 4 is in the vicinity of the terminal to be formed in the subsequent step.

Next, as shown in FIG. 5(d), a metal for contact point, such as gold or nickel, is formed in the form of a thin film by plating on the bottom in an opening 1a formed on the base insulating layer 1 (to which the release layer is exposed) to yield the external connecting conductor 6c.

Next, as shown in FIG. 5(e), the opening 1a is filled with a metal for conductor layer to obtain a conductive path, and a conductor layer 2 is further formed as a circuit pattern on the upper face of the base insulating layer 1. Furthermore, a terminal 3 is formed by soldering on the upper face of the conductor layer 2. Undercoating for allowing the metal to be precipitated preferably on the upper face of the base insulating layer or in the opening may be performed as appropriate.

In the explanation referring to FIG. 5, the thin metal film 6c in the opening 1a and the conductor layer 2 are formed after forming the supporting column 4 in advance, but the supporting column 4 may be formed after forming the conductor layer 2.

Next, as shown in FIG. 5(f), the entire upper face of the base insulating layer 1 is covered with an adhesive layer 5 to embed the conductor layer 2, terminal 3, and supporting column 4 in the adhesive layer, whereby the wiring circuit structure of the present invention is obtained.

In the manufacturing method for a semiconductor device according to the present invention, a semiconductor device having a wiring circuit structure is obtained by superposing the wiring circuit structure according to the present invention on a semiconductor element with a bump (particularly a stud bump) provided on an electrode, and connecting the terminal to the bump of the element. The connection between the wiring circuit structure and the semiconductor element may be established using a publicly known technique.

Figure 6:
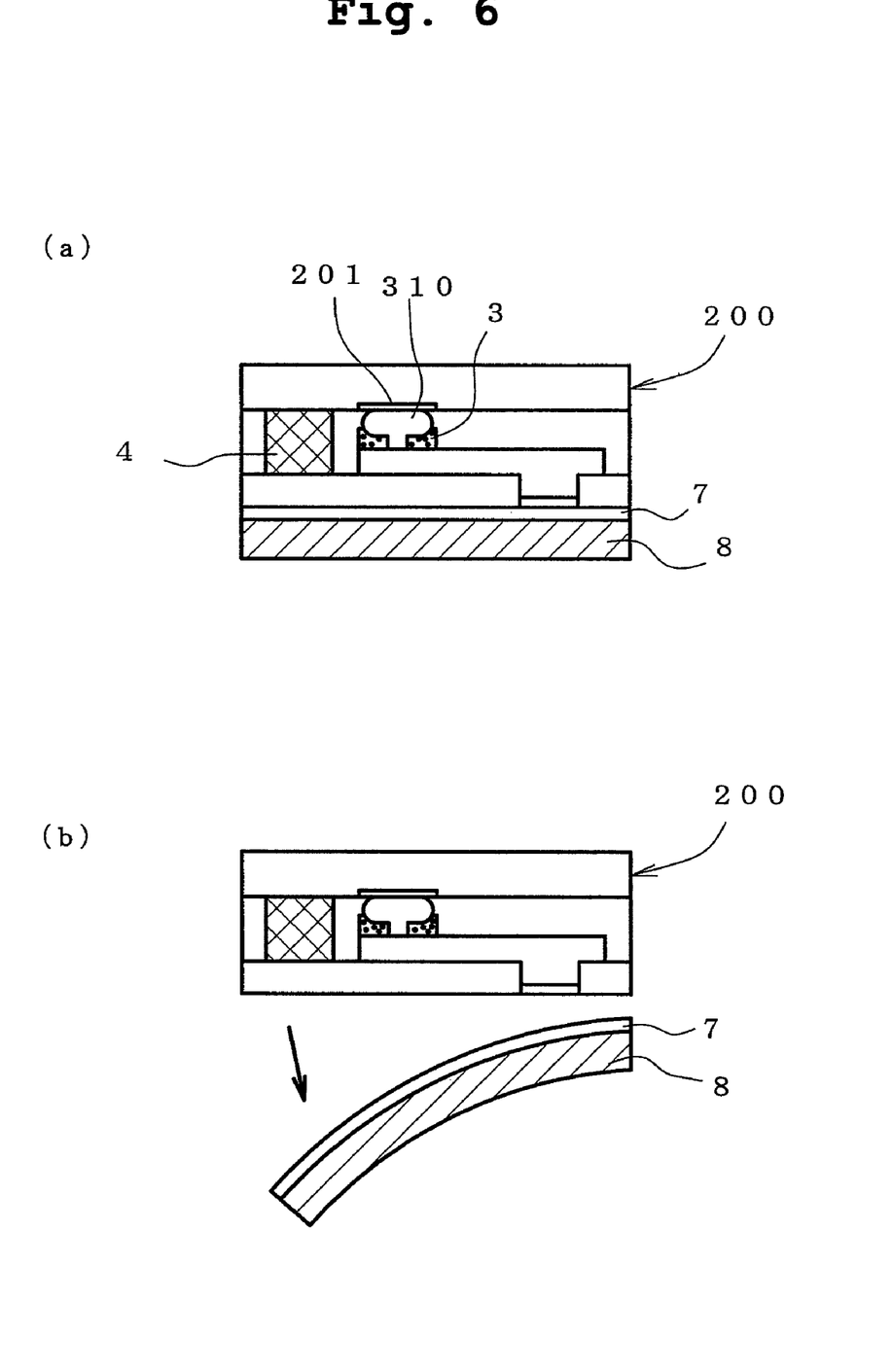
FIG. 6 shows a preferred embodiment of the manufacturing method according to the present invention.

In a preferred embodiment of the manufacturing method, a wiring circuit structure having a metal support substrate in a way such that the metal support substrate can be separated is joined to an element in the form of a semiconductor wafer, after which the metal support substrate is separated, and the substrate is divided into chips to yield individual semiconductor devices, as shown in FIG. 6.

First, as shown in FIG. 6(a), a semiconductor wafer 200 and a wiring circuit structure (with a metal support substrate) are superposed and pressure-bonded together in a way such that each stud bump 310 of the element and each terminal 3 of the wiring circuit structure will face each other, to connect the stud bump and the terminal. In this case, the bonding of the two members relies solely on the adhesive force of the adhesive layer, and heat or ultrasonic vibration may be added to melt-bind the stud bump and the terminal.

In this operation, even if the pressure exerted on some stud bumps is in excess, the supporting column comes in contact with the surface of the semiconductor wafer and acts as a spacer to terminate excess compression, thus preventing the stud bump from being overcompressed to prevent the contact the solder of the terminal with the aluminum electrode.

Next, as shown in FIG. 6(b), the metal support substrate 8, together with the release layer 7, is detached to yield a semiconductor wafer provided with a wiring circuit structure, which is divided into individual chips by dicing to yield a semiconductor device.

Example

In this Example, a wiring circuit structure of wafer size to be superposed on a semiconductor wafer and connected to individual elements (a structure of wafer size consisting of collectively provided wiring circuit structures of chip size; hereinafter also referred to as a set of wiring circuit structures) was prepared, and the status of connection between the terminal and the stud bump was examined by variously changing the thickness t of the terminal to change the height h of the terminal, and changing the height H of the supporting column.

Two semiconductor wafers to be connected were provided, one having a protrusion height B of 20 μm of the stud bump of the element, and the other 50 μm.

The set of wiring circuit structures is a set of a number of wiring circuit structures corresponding to the elements in the semiconductor wafer, obtained by forming a release layer consisting of polyimide on one metal support substrate of wafer size, forming a base insulating layer thereon, and forming a conductor layer (circuit pattern), terminal, supporting column, and adhesive layer at the positions corresponding to the individual elements of the semiconductor wafer.

[Formation of Release Layer on Metal Support Substrate]

As shown in FIG. 5(a), a metal support substrate made of 36 alloy having a thickness of 30 μm was provided as a metal support substrate 8, and a titanium layer having a thickness of 100 nm was formed on the entire surface thereof by sputtering to yield a release layer 7.

[Formation of Base Insulating Layer]

As shown in FIG. 5(b), a polyimide layer was formed on the upper face of the release layer 7 to yield a base insulating layer 1 using photosensitive polyamic acid (a reaction product of 3,4,3',4'-biphenyltetracarboxylic dianhydride, 4,4'-diaminodiphenyl ether and para-phenylenediamine, containing a photosensitizer). A circular opening 1a having a diameter of 100 μm was formed at the position where the external connecting conductor described below was to be formed, and the upper face of the release layer was exposed to the bottom in the opening.

[Formation of Supporting Column]

As shown in FIG. 5(c), a supporting column was formed by photolithography using the same photosensitive polyamic acid as the material for the above-described base insulating layer. The supporting column had a square bottom having 100 μm sides.

The height H of the supporting column was set at 30 μm, 40 μm, 50 μm, and 60 μm for each wiring circuit structure of wafer size, as shown in Table 1 below. Among the wiring circuit structures contained in the same single set, the height of the supporting column (design value) was constant.

For the other portions as well, dimensions were constant among the individual wiring circuit structures contained in the same single set.

The supporting column was arranged at a position where a 10 μm gap would be produced between the supporting column and the terminal 3 formed in the subsequent step.

[Formation of External Connecting Conductor, Conductor Layer, and Terminal]

As shown in FIG. 5(d), a surface layer 6c for the external connecting conductor was formed by electroplating on the upper face of a release layer 7 exposed as the bottom in an opening portion 1a of a base insulating layer 1 in the order of gold (0.5 μm thick) and nickel (2 μm thick). In FIG. 5(d), the surface layer 6c is illustrated as a single layer.

As shown in FIG. 5(e), the upper face of the base insulating layer 1 was subjected to copper electroplating by the semi-additive method, the opening 1a was filled with copper to obtain a conductive path 6, and a conductor pattern having a thickness of 10 μm was further formed to obtain a conductor layer 2. Furthermore, a solder layer was formed at the terminal formation position on the conductor layer by electroplating to obtain a terminal 3. As viewed from above, the terminal was a circle having a diameter of 100 μm.

As shown in Table 1 below, the thickness t of the solder layer formed as the terminal was changed for each set of wiring circuit structures: 10 μm, 20 μm, and 30 μm. Being the sum of the thickness t of each of these solder layers and the thickness 10 μm of the conductor layer 2, the height h of the terminal from the upper face of the base insulating layer was 20 μm, 30 μm, and 40 μm for each set of wiring circuit structures.

[Formation of Adhesive Layer]

A polyimide-based adhesive layer 5 was formed by the casting method in a way such that all of the various portions formed on the base insulating layer in the above-described step (supporting column, conductor layer, terminal) would be covered, to yield a wiring circuit structure.

The thickness of the polyimide-based adhesive layer from the upper face of the base insulating layer was H+5 μm.

[Electrode and Bump of Each Element of Semiconductor Wafer]

The electrode of each element in the semiconductor wafer provided was a square aluminum electrode having 80 μm sides, wherein a gold stud bump having a maximum outside diameter of 60 μm had been formed on the electrode with a bonding wire 25 μm across.

A first type of semiconductor wafer has a protrusion height B of the gold stud bump of 20 μm as measured from the element surface, and a second type of semiconductor wafer has a protrusion height B of the gold stud bump of 50 m as measured from the element surface.

The number of electrodes per element is 40, and the number of elements in one semiconductor wafer is 568.

[Connection of Semiconductor Wafer and Wiring Circuit Structure]

A semiconductor wafer and a wiring circuit structure were pressure-bonded and thermally connected to yield a semiconductor device. The bonding was achieved in a degree of vacuum of 3 Pa at a temperature of 250° C. under an applied pressure of 10 g per bump.

The dimensions and connection statuses of major parts of each semiconductor wafer and each set of wiring circuit structures are shown in Table 1 below. For all numerical figures in the table, the unit of measurement is μm.

TABLE 1

|  | Wiring circuit structure | | | | Rating | |
| --- | --- | --- | --- | --- | --- | --- |
|  | Element Height B of bump | Thickness t of terminal | Height h of terminal | Height H of supporting column | Contact of electrode and solder | Contact failure |
| Sample 1 | 20 | 20 | 30 | 40 | None | None |
| Sample 2 | 20 | 30 | 40 | 50 | None | None |
| Sample 3 | 20 | 10 | 20 | 30 | None | None |
| Sample 4 | 20 | 20 | 30 | 60 | None | Present |
| Sample 5 | 20 | 20 | 30 | 30 | Present | None |
| Sample 6 | 50 | 20 | 30 | 30 | None | Present |

As shown in Table 1 above, a first type of semiconductor wafer was used for Samples 1 to 5, and a second type of semiconductor wafer for Sample 6.

In Sample 1, h<H<h+B is satisfied because of B=t=20 (a bump with the provision of t≧B and also because of h=30, H=40, and h+B=70.

In Sample 2, h<H<h+B is satisfied because of B=20 and t=30 (a bump with the provision of and t≧B) also because of h=40, H=50, and h+B=90.

In Sample 3, B<H<h+B is satisfied because of B=20 and t=10 (a bump with the provision of t<B) and also because of h=20, H=30, and h+B=50.

In all these samples with a supporting column provided to meet the conditions of the present invention, the solder of the terminal was not in contact with the electrode of the element, and the contact between the stud bump and the terminal was good.

In Sample 4, H<h+B is not satisfied because of h=30, H=60, and h+B=50 despite B=t=20 (a bump with the provision of t≧B). In this sample, there was no connection where the solder of the terminal came into contact with the electrode of the element because the height H of the supporting column was excessively high, but there were some pairs of a stud bump and a terminal that cannot come into contact with each other.

In Sample 5, h<H is not satisfied because of h=30, H=30, and h+B=50 despite B=t=20 (a bump with the provision of t≧B). In this sample, there were some pairs where the supporting column did not function as a stopper because the height H of the supporting column was excessively low; although all pairs of a stud bump and a terminal had normal connection, there were some pairs where the solder of the terminal came in contact with the electrode of the element.

In Sample 6, h<H is not satisfied because of h=30, H=30, and h+B=80 despite B=50 and t=20 (a bump with the provision of t<B). There were some pairs where the supporting column did not function as a stopper because the height H of the supporting column was excessively low; the stud bump fretted in the terminal excessively, and there was poor connection between the bump and the terminal. There were no pairs where the solder of the terminal came into contact with the electrode of the element.

These results demonstrate that a stud bump and a terminal are preferably connected by providing a supporting column and choosing an appropriate height thereof.

According to the present invention, even if there is variation in the height of a bump formed in an electrode of a semiconductor element, contact of the material for the terminal of the wiring circuit structure with the electrode of the element is prevented, and the reliability of the contact between the two members improves.

This application is based on Patent Application No. 2009-270430 filed in Japan, the contents of which are incorporated in full herein.

The invention claimed is:

1. A wiring circuit structure to be connected to a semiconductor element having a bump provided on an electrode thereof, comprising:
 at least a structure having a conductor layer formed as a circuit pattern on a base insulating layer, and a terminal for connection to the bump of the semiconductor element formed on the conductor layer, wherein:
 a supporting column is formed in the vicinity of the terminal on the upper face of the base insulating layer,
 supposing the protrusion height of the bump from the semiconductor element to be connected is B, the height of the supporting column is H, the height of the terminal is h, and the layer thickness of the terminal is t, as measured from the upper face of the base insulating layer as the reference surface,
 the height H of the supporting column is determined to satisfy;
 B<H<h+B when a semiconductor element having a bump with the provision of t<B is to be connected, or
 h<H<h+B when a semiconductor element having a bump with the provision of t≧B is to be connected;
 whereby compression that causes the terminal to reach the electrode of the element is prevented by the presence of the supporting column when the wiring circuit structure is superposed on the semiconductor element to bring the terminal into contact with the bump of the element, and the two members are pressed and connected to each other.

2. The wiring circuit structure according to claim 1, wherein the height H of the supporting column is determined;
 to satisfy B<H<h+B when a semiconductor element having a bump with the provision of t<B and h<B is to be connected, or to satisfy h<H<h+B when a semiconductor element having a bump with the provision of t≧B and h≧B is to be connected.

3. The wiring circuit structure according to claim 1, wherein protrusion height B of the bump from the semiconductor element to be connected is 20 μm to 60 μm.

4. The wiring circuit structure according to claim 1, wherein the semiconductor element is in the form of a semiconductor wafer prior to division with a plurality of semiconductor element structures formed on a wafer substrate, and
the wiring circuit structure is a set of a required number of individual wiring circuit structures collectively provided and adjacently joining to each other to allow themselves to be connected to the individual semiconductor elements in the semiconductor wafer, the individual base insulating layers linking together to form one base insulating layer.

5. The wiring circuit structure according to claim 1, wherein the supporting column is formed with the same material as the base insulating layer.

6. The wiring circuit structure according to claim 1, wherein at least the surface layer of the terminal made of a solder.

7. The wiring circuit structure according to claim 1, wherein the base insulating layer is formed on a metal support substrate in a way such that the base insulating layer can be separated.

8. A method of producing a semiconductor device having a structure comprising a lamination of a semiconductor element with a bump provided on an electrode and a wiring circuit structure, comprising the step of connecting the terminal of the wiring circuit structure of claim 1 to the bump of the semiconductor element.

9. The manufacturing method according to claim 8, wherein the semiconductor element is in the fault of a semiconductor wafer prior to division with a plurality of semiconductor element structures formed on a wafer substrate,
the wiring circuit structure being a set of a required number of individual wiring circuit structures collectively provided and adjacently joining to each other to allow themselves to be connected to the individual semiconductor elements in the semiconductor wafer, and the base insulating layers contained in each wiring circuit structure linking together to form one base insulating layer.

10. The manufacturing method according to claim 9, wherein the base insulating layer is formed on a metal support substrate in a way such that the base insulating layer can be separated, comprising the step of separating the metal support substrate from the base insulating layer after the step of connecting the terminal of the wiring circuit structure to the bump of the semiconductor element.

* * * * *